United States Patent [19]
Ueda et al.

[11] Patent Number: 5,212,459
[45] Date of Patent: May 18, 1993

[54] LINEARIZED AND DELAY COMPENSATED ALL CMOS VCO

[75] Inventors: Shunsaku Ueda, Carlsbad; Kwai-Kwong Lam, Margarita; Craig Robertson, Mountain View, all of Calif.

[73] Assignee: Silicon Systems, Inc., Tustin, Calif.

[21] Appl. No.: 960,534

[22] Filed: Oct. 13, 1992

Related U.S. Application Data

[63] Continuation of Ser. No. 792,222, Nov. 12, 1991, Pat. No. 5,155,452.

[51] Int. Cl.$^5$ ............................................. H03K 3/03
[52] U.S. Cl. .................................... 331/111; 331/143; 331/177 R
[58] Field of Search ...................... 331/111, 143, 177 R

[56] References Cited

U.S. PATENT DOCUMENTS 4,590,444  5/1986  Wilcox ............................... 331/111
5,093,634  3/1992  Khoury ........................ 331/177 R X Primary Examiner—Siegfried H. Grimm
Attorney, Agent, or Firm—Hecker & Harriman

[57] ABSTRACT

The present invention provides a linearized and delay compensated all CMOS voltage controlled oscillator. A transconductance converter receives a control voltage input and provides a control current to a current controlled ramping circuit that is responsible for providing two ramping voltage outputs to the positive inputs of two comparators. These comparators compare the ramping voltages to a threshold voltage and provide pulses to a latch when the ramping voltages cross the threshold voltage. The latch provides the oscillating output of the circuit which is fed back to the current controlled ramping circuit for switching purposes. A compensation loop receives both the oscillating output of the latch and the control current as inputs and provides the threshold voltage to the comparators. The compensation loop contains a similar current controlled ramping circuit which provides ramping outputs identical to those of the first current controlled ramping circuit. Track-and-hold circuits triggered by the oscillating outputs provide the peak voltages of the ramping outputs through a low-pass filter to the negative input of a difference amplifier. An external reference voltage is supplied to the positive input of the difference amplifier and the output of the difference amplifier is provided as the threshold voltage to the comparators. The effects of the comparator delay and the latch delay are cancelled out by the compensation loop.

1 Claim, 8 Drawing Sheets

LINEARIZED AND DELAY COMPENSATED ALL CMOS VCO

This is a continuation of application Ser. No. 192,222, filed Nov. 12, 1991, now U.S. Pat. No. 5,155,452.

BACKGROUND OF THE INVENTION

1. Field of the Invention

This invention relates to the field of voltage controlled oscillators.

2. Background Art

In data recovery circuitry, digital data may be provided as a serial stream of pulses occurring at a certain data frequency. The recovery circuitry must have the ability to lock on to this data frequency in order to extract the digital information in a synchronous manner. One way to accomplish this is to utilize a voltage controlled oscillator (VCO) in a phase lock loop.

A voltage controlled oscillator produces an output signal at a certain oscillation frequency. This oscillating output is then compared with the incoming data signal to determine phase and frequency differences between the two signals. This difference is converted into a control voltage that is provided to the voltage controlled oscillator to drive the output frequency either up or down to match the incoming data frequency. For optimized performance at higher frequencies, the VCO should have a linear frequency versus voltage transfer function. For circuitry designed in an all-CMOS process, prior art VCO's do not have an acceptable response at higher operating frequencies. A block diagram of an example VCO design is illustrated in FIG. 1.

A control voltage $V_{IN}$ (10) is provided to a ramping means (11). The ramping means is coupled to a comparator block (13), which is in turn coupled to a latch (15). The latch provides the oscillating output to the ramping means (11) and to the phase lock loop.

The ramping means 11 provides a first ramping voltage signal to comparator block 13. The ramping voltage falls (or rises) until a signal on line 16, the oscillating output, triggers a reset of that ramping signal. At this point, a second ramping signal begins. When the second ramping signal is reset by the oscillating output, the first ramping signal begins falling (or rising) again. In comparator block 13, a comparator is used as threshold crossing detector. When the comparator detects that the ramping voltage provided from ramping means 11 has crossed a threshold voltage, the comparator block 13 provides a pulse to latch 15 to change the state of the latch. The state of the latch then provides the oscillating output $F_{OUT}$ on line 16 to the phase lock loop circuit and to the ramping means to control the switching of the ramping signals.

The time it takes for the ramping signals within the ramping means 11 to fall (or rise) from their original position to the threshold voltage, is the ideal time of the VCO half cycle, $T_H$, where the half cycle is designed to be inversely proportional to the control voltage VN. Thus the ideal frequency function is given by:

$$F_{OUT} = \frac{1}{2T_H} \qquad \text{(equation 1)}$$

However, the ramping means does not switch the ramping voltage until latch 15 has changed states. Therefore, once the ramping voltage has crossed the threshold voltage, the comparator must detect the crossing and the latch must change states before the actual half cycle is completed. Thus an inherent delay caused by the comparator and the latch is introduced into the frequency function of the VCO. Therefore the actual half cycle of the VCO is $T_H' = T_H + \text{delv}$, where delv is the comparator/latch delay. The frequency function of the circuit becomes:

$$F_{OUT} = \frac{1}{2T_H'} = \frac{1}{2(T_H + \text{delv})} \qquad \text{(equation 2)}$$

This delay term causes a nonlinearity in the transfer function of the circuit as frequencies rise to the level at which the ideal half cycle is of the same order of magnitude as the delay term. In an all CMOS VCO, this delay can be significant. Therefore, the frequency versus voltage transfer function of the VCO, and consequently the phase locking ability of the phase lock loop, is unacceptable for use in some applications.

FIG. 2 illustrates the frequency versus voltage characteristics of an ideal VCO and the VCO of FIG. 1. As shown, the ideal frequency response is represented by the solid line with a slope of $1/(2 T_H)$. The actual frequency response is represented by the dashed line which flattens out towards a frequency limit of $1/(2 \text{ delv})$. Thus the useable frequency range of the actual VCO is reduced.

A prior art voltage-controlled oscillator with a compensation loop is shown in FIG. 3. This circuit is disclosed in the article, "A 30 MHz Low-Jitter, High-Linearity CMOS Voltage-Controlled Oscillator", by Wakayama and Abidi in the *IEEE Journal of Solid State Electronics*, Vol. SC-22, No. 6, December, 1987, pgs. 1074–1080.

Transconductance (GM) converter 101 receives control voltage input signal 100 and outputs control current signals 130 and 113. Control current 130 is provided to VCO core block 102. VCO core 102 is coupled through ramp node 117 to capacitor 114 ($C_V$), level shifter 103 and the negative input of comparator 105. VCO core 102 is also coupled through ramping node 118 to capacitor 114, level shifter 104 and the negative input of comparator 106. Level shifter 103 is coupled through line 119 to the positive input of comparator 106. Level shifter 104 is coupled through line 120 to the positive input of comparator 105. The output 121 of comparator 105 is coupled to the "set" input of latch 107. The output 122 of comparator 106 is coupled to the "reset" input of latch 107. The "Q" output of latch 107 provides the clock output 115 (clk+), which is fed back to VCO core 102. The "Q*" output of latch 107 provides the inverted clock output 116 (clk−), which is also fed back to VCO core 102. The standard VCO block of this circuit comprises VCO core 102, level shifters 103 and 104, comparators 105 and 106, and latch 107.

The compensation loop for this prior art circuit comprises the divide-by-four circuit 108, clock generator circuit 109, frequency/voltage converter block 110 and difference amplifier 111. The divide-by-four circuit 108 is coupled to clock output 115 and inverted clock output 116 and also to clock generator 109. Clock generator 109 provides multi-phase clock signals through bus 123 to frequency/voltage converter 110. Frequency/voltage converter 110 receives current control signal 113 from transconductance converter 101 and provides a voltage signal 126 to the negative input of difference amplifier 111 and capacitor 112 (Chold). A bandgap reference voltage is provided to the positive input of the difference amplifier. The output of difference amplifier 111 is provided to node 125 which is also coupled to capacitor 112 and level shifters 103 and 104.

Transconductance converter 101 is responsible for driving the VCO core of this oscillator. Ideally, the transconductance converter satisfies the equation:

$$I(t) = gm V_{IN}(t) \quad \text{(equation 3)}$$

where gm is the transconductance value of block 101. Thus, a change in input voltage brings about a proportional change in output current.

The VCO core block 102 is constructed such that one output node has a low impedance path to a positive voltage supply while the other output node is discharging floating capacitor 114, $C_V$, at a rate defined by control current 130. The inverted and non-inverted clock signals, 116 and 115, are responsible for switching the circuit so that the output nodes alternate between the conditions described. Nodes 117 and 118 thus convey alternating ramping voltages.

Level shifters 103 and 104 are utilized to shift the input voltage, nodes 117 or 118, by an adjustable DC value. This value is determined by the level shift control voltage on line 125. Comparator 105 outputs a true value when the ramping voltage on line 117 falls below the level shifted voltage signal 118 provided on line 120. Comparator 106 provides a true output value when ramping voltage signal 118 falls below level shifted voltage signal 117 provided on line 119.

Latch 107 is a set-reset flip-flop which conforms to the following truth table:

| S | R | Q (n + 1) | Q* (n + 1) |
|---|---|-----------|------------|
| 0 | 0 | Q (n)     | Q* (n)     |
| 0 | 1 | 0         | 1          |
| 1 | 0 | 1         | 0          |
| 1 | 1 | —         | —          | where 0 represents a logical false value, and 1 represents a logical true value. As shown by the truth table, a change of state only occurs if the S(set) input is asserted while the Q output is low, or if the R(reset) input is asserted while the Q output is high. The Q and Q* outputs of the set reset flip-flop are the oscillating outputs of the system, labeled $F_{OUT}$.

The half cycle of the VCO core circuit is $C\Delta V/I$, where C is the capacitance of capacitor 114, $\Delta V$ is the voltage difference between the maximum voltage of signals 117 and 118 and the threshold voltage provided by their level shifted counterpart as seen by the comparators, and I is the control current 130. The ideal VCO transfer function is:

$$F_{OUT} = \frac{I}{2C\Delta V} \quad \text{(equation 4)}$$

where FOUT is the frequency of oscillating outputs 115 and 116. However, due to the inherent delay of the comparator and latch, the actual half cycle of the VCO is:

$$T_H = C\Delta V/I + delv \quad \text{(equation 5)}$$

where delv is the delay of the comparators and latch. Thus, the actual VCO transfer function is:

$$F_{OUT} = \frac{I}{2(C\Delta V + I delv)} \quad \text{(equation 6)}$$

The delay of the comparators and latch in the VCO causes a non-linearity in the transfer function which becomes significant as frequencies approach the point where the term $C\Delta V/I$ is on the same order of magnitude as delv.

A VCO of this form without the compensation loop, considering a one micron CMOS process, may operate linearly only up to about 20 MHz. The one sigma center frequency distribution may be larger than 4 MHz and temperature distortion may be higher than one percent per degree Celsius. A limited frequency range and the variation in the characteristics are unacceptable for almost all applications. For these reasons, a linearizing compensation loop is needed. The primary purpose of the compensation loop is to decrease the half cycle of the VCO core to compensate for the delay term at higher frequencies.

In the prior art FIG. 3, the compensation scheme centers around a frequency-to-voltage converter. The frequency-to-voltage converter is used to generate the effective trip-point voltage for the comparators. The frequency-to-voltage converter uses a six-phased clock running at one-quarter the VCO frequency. The output voltage of the frequency-to-voltage converter is then integrated and compared with a preset reference voltage to generate a compensated level shift control voltage.

In the compensation loop of FIG. 3, block 108 receives oscillating outputs 115 and 116 and supplies clock generator 109 with clock signals at one-quarter of the output oscillating frequency. Clock generator 109 provides clock signals of six different phases to frequency-to-voltage converter 110.

The frequency-to-voltage converter utilizes current signal 113, which is proportional to control current 130, to generate a voltage output which is related to the frequency input. The transfer function for the frequency-to-voltage converter is:

$$V_{F/V} = [KIT' + (VPOS)C_P]/C' \quad \text{(equation 7)}$$

where $V_{F/V}$ is the voltage output, K is the proportionality constant between signals 130 and 113, VPOS is the positive voltage supply value, $C_P$ is the parasitic capacitance within the frequency-to-voltage converter, and C' is the sum of $C_P$ and the charging capacitance, $C_F$, within the frequency-to-voltage converter. T' is equal to the charging time within the converter, $1/F_{OUT} + delf$, where delf is a delay term for the inherent delay within the frequency-to-voltage converter caused by asymmetric switching times of the current switches in the converter, turn-on versus turn-off, rise-time versus fall-time, etc.

This converter works by integrating reference current 113, that is proportional to control current 130, onto a second capacitor that is ratioed to capacitor 114. The integration time is determined by the period of the VCO oscillating outputs 115 and 116.

The voltage integrated on the second capacitor is provided as output 126 to difference amplifier 111. The difference amplifier compares the output of the frequency-to-voltage converter with a reference voltage 124 and generates a level shift control voltage 125 for level shifters 103 and 104. The level shift control voltage provided by the difference amplifier 111 is:

$$V_{comp} = Ref - (C_F/C_H)(V_{F/V} - Ref) \quad \text{(equation 8)}$$

where $V_{comp}$ is the compensated level shift control voltage, $(C_F/C_H)$ is the gain of the difference amplifier, $C_H$ is the capacitance of capacitor 112, and Ref is the reference voltage. As the frequency of the oscillator rises, the output voltage of the frequency-to-voltage converter decreases and serves to decrease the level shift control voltage according to the above equation. As the level shift control voltage is decreased, the threshold voltages in the comparators are brought closer to the falling ramping voltage thus acting to decrease the half cycle of the VCO core. This serves to compensate for the delay time of the comparators and latch.

The time it takes for the VCO ramp to reach $V_{comp}$ is:

$$1/F_{OUT} - delv = (C_V V_{comp})/I \quad \text{(equation 9)}$$

Assuming for simplicity that $K=1$, $C_H << C_F$, and $C_P << C'$, an approximation for the compensated transfer function of the VCO is:

$$F_{OUT} = I/(2\{[Ref\, C_F - C_P VPOS] + I[(C_H/C_V)delv - delf]\}) \quad \text{(equation 10)}$$

for the case where $C_V/C_H >> 1$. Equation 9 shows that the VCO delay term, delv, is reduced by the factor $C_H/C_V$. However, two new delay terms have been introduced by the compensation circuit. "delf" provides an uncompensated contributing factor to nonlinearity that becomes critical at frequencies where $RefC_F/I$ approaches delf, and "$C_P VPOS$" causes a shift from the design goal in the voltage to frequency relationship and degenerates the PSRR due to its dependence on the power supply.

SUMMARY OF THE PRESENT INVENTION

The present invention provides a linearized and delay compensated all CMOS voltage controlled oscillator. A transconductance converter receives a control voltage input and provides a control current to a current controlled ramping circuit that is responsible for providing two ramping outputs to the positive inputs of two comparators. These comparators compare the ramping voltages to a threshold voltage and provide pulses to a latch when the ramping voltages cross the threshold voltage. The latch provides the oscillating output of the circuit which is fed back to the current controlled ramping circuit for switching purposes. A compensation loop receives both the oscillating output of the latch and the control current as inputs and provides the threshold voltage to the comparators.

The compensation loop contains a similar current controlled ramping circuit that provides ramping outputs substantially the same as those of the first current-controlled ramping circuit. Track-and-hold circuits triggered by the oscillating outputs provide the peak voltages of the ramping outputs through a low-pass filter to the negative input of a difference amplifier. An external reference voltage is supplied to the positive input of the difference amplifier and the output of the difference amplifier is provided as the threshold voltage to the comparators. The effects of the comparator delay and the latch delay are cancelled out by the compensation loop.

DETAILED DESCRIPTION OF THE INVENTION

A linearized and delay-compensated all CMOS voltage-controlled oscillator is described. In the following description, numerous specific details are set forth to provide a more thorough understanding of the present invention. It will be apparent, however, to one skilled in the art, that the present invention may be practiced without these specific details. In other instances, well-known circuits have not been described so as not to obscure the present invention.

The present invention is a voltage-controlled oscillator with a compensation loop which provides for linearization of the VCO transfer function and compensation of the internal delay of the comparators and latch within the VCO circuit. A control voltage is supplied to a transconductance converter that provides a control current to a current-controlled oscillator block and a compensation loop. The current-controlled oscillator provides an oscillating output to the compensation loop and receives a threshold "trip" voltage signal from the compensation loop. The compensation loop utilizes peak detector circuits to provide the previous oscillator threshold voltage to a difference amplifier. The previous threshold voltage is compared with an external reference voltage. The output of the difference amplifier is provided as the threshold "trip" voltage to the current-controlled oscillator. This feedback scheme provides for reduced sensitivity to variations in the VCO transfer function due to variations in FET switching speed caused by to temperature and manufacturing processes. It also serves to increase the upper operating range of the VCO by minimizing the effects of the comparator/latch delay. The present invention may also be utilized as a current-controlled oscillator by neglecting the transconductance converter.

Figure 1:
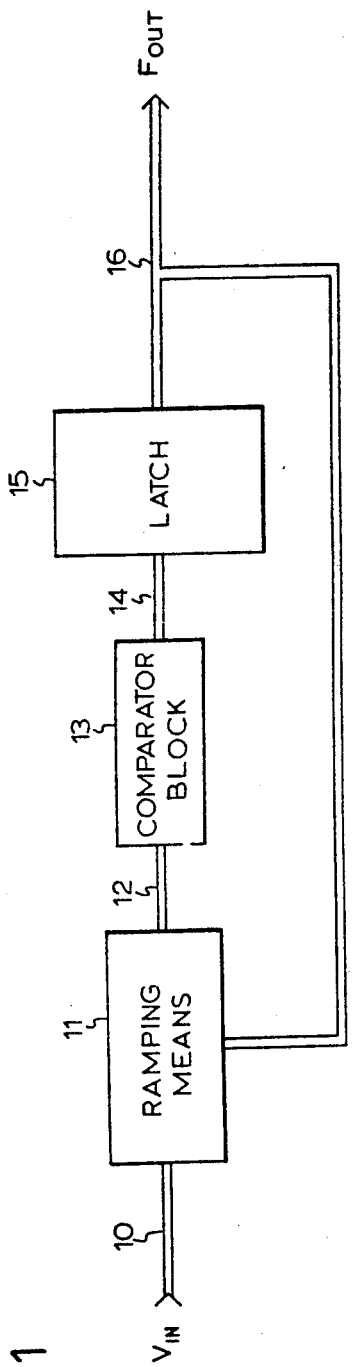
FIG. 1 is a block diagram of a simple voltage-controlled oscillator.
Figure 2:
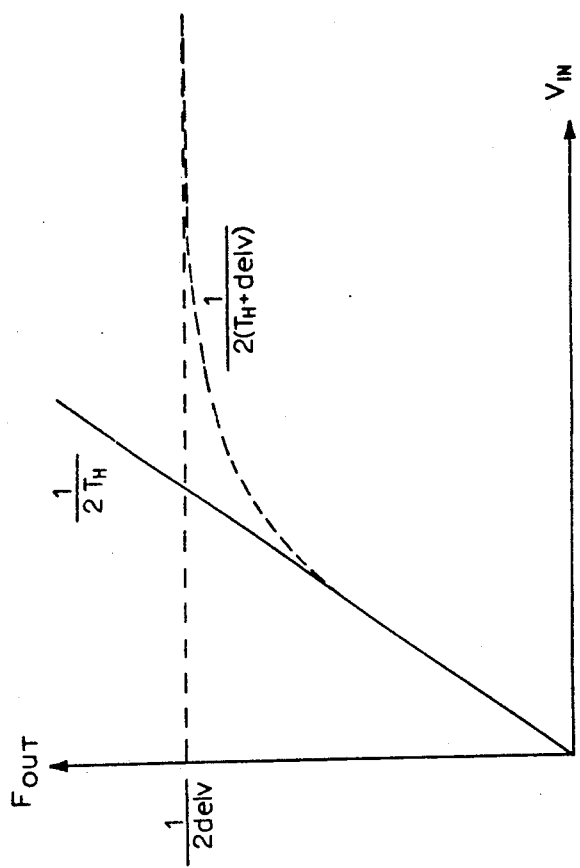
FIG. 2 is a graph of the frequency versus voltage characteristics of a simple VCO.
Figure 3:
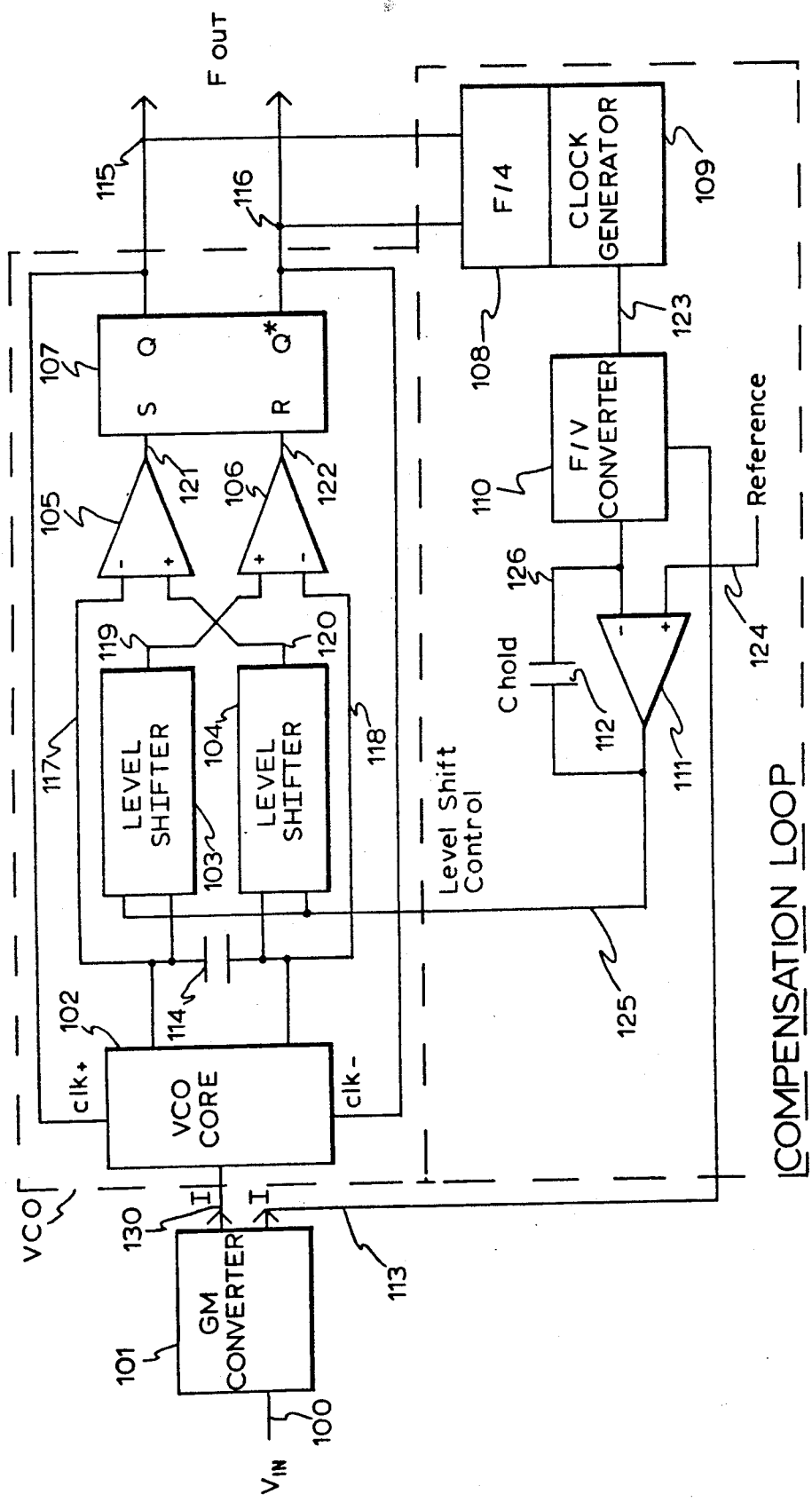
FIG. 3 is a block diagram of a prior art voltage controlled oscillator having a compensation loop.
Figure 4:
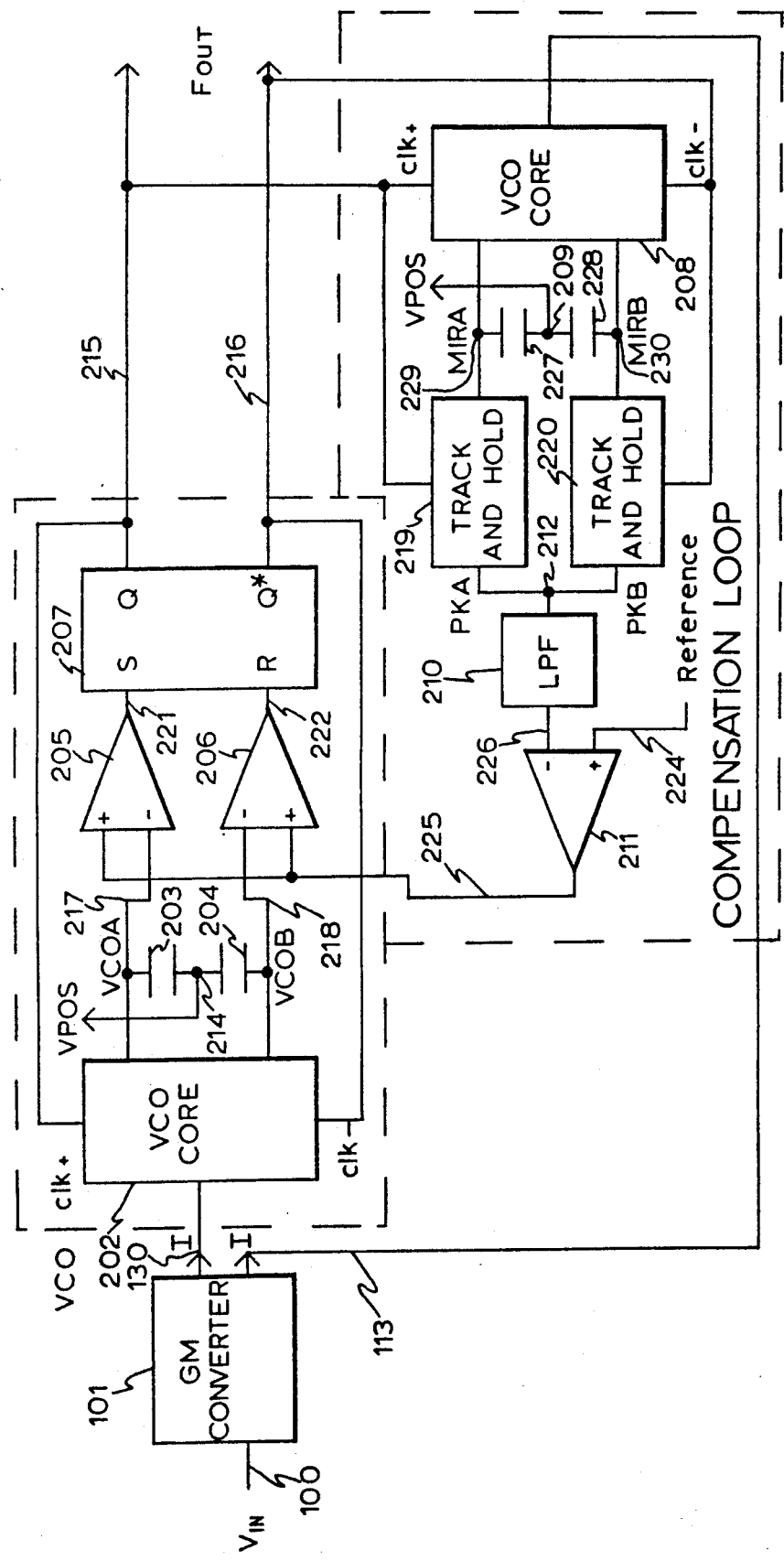
FIG. 4 is a block diagram of the preferred embodiment of the delay-compensated voltage controlled oscillator of the present invention.

The approach of the present invention uses a peak detector in such a way that the delay term, delf, in the frequency-to-voltage equation (equation 10) is eliminated. Also, the compensation circuit of the present invention does not introduce a supply-dependent, parasitic delay term. A block diagram of the present invention is shown in FIG. 4.

Transconductance converter 101 receives the input voltage $V_{IN}$ 100 and provides control currents 130 and 113. Control current 113 is equivalent to control current 130 in this method. VCO core 202 receives control current 130 and generates alternating ramping voltages VCOA and VCOB on nodes 217 and 218, respectively. The switching of these ramping voltages is controlled by clock signal 215 (clk+) and inverted clock signal 216 (clk−). Contrary to the design of the prior art, the present invention does not use a floating capacitor 114, but utilizes two individual capacitors, 203 and 204, attached to a positive voltage source from nodes 217 and 218, respectively. Nodes 217 and 218 are then directly coupled to the negative inputs of comparators 205 and 206, respectively. Comparators 205 and 206 receive a threshold voltage signal on line 225 at the positive comparator inputs. Comparator 205 is coupled to the set input of set/reset flip-flop 207 through line 221. Comparator 206 is coupled to the reset input of S/R flip-flop 207 through line 222. The Q and Q* outputs of flip-flop 207 are provided to lines 215 and 216, respectively, as the oscillating outputs of the system ($F_{OUT}$). These oscillating outputs 215 and 216 are fed back to VCO core 202. The VCO block of this system is comprised of VCO core 202, capacitors 203 and 204, comparators 205 and 206, and latch 207. No level shifters are required for this design.

The compensation loop for this circuit begins with the VCO core block 208 receiving control current 113 and clock signals 215 and 216. The outputs of VCO core circuit 208 are provided to nodes 229 and 230 and are designated MIRA and MIRB because they mirror the voltages at VCOA and VCOB in the primary VCO block 202. Nodes 229 and 230 are coupled to capacitors 227 and 228, respectively. Capacitors 227 and 228 are also coupled to a positive voltage supply. Nodes 229 and 230 are provided to track-and-hold circuits 219 and 220, respectively. Track-and-hold circuit 219 is designed to hold the peak value of node 229 taken on the rising edge of clock signal 215. Conversely, track-and-hold circuit 220 is designed to hold the peak value of node 230 taken on the rising edge of clock signal 216. The outputs of track-and-hold circuits 219 and 220, labeled PKA and PKB, respectively, are provided through node 212 to low pass filter 210 in an alternating fashion. Low pass filter 210 provides the filtered output to the negative input of difference amplifier 211. Difference amplifier 211 receives a reference voltage 224 on its positive input and generates threshold voltage at its output on line 225. This threshold voltage 225 is provided to the positive inputs of comparators 205 and 206 as the trip voltages for the oscillator.

The VCO core of the present invention operates such that node 217, coupled to capacitor 203, is being charged up to the positive voltage supply value while node 218 is ramping down from the positive voltage supply value toward the negative voltage supply value at a rate determined by control current I. After VCOB at node 218 falls below threshold voltage 225, comparator 206 will reset latch 207 which in turn will switch the VCO core such that node 218 charges up to the positive voltage supply and node 217 begins to ramp down towards the negative voltage supply. Once the voltage VCOA on node 217 drops below the threshold voltage 225, comparator 205 will set latch 207 and thus trigger another cycle in the VCO core. VCOA and VCOB are not compared with each other, but with a set threshold voltage signal provided by the compensation loop. Thus, the present invention has an advantage over the prior art VCO block in that it does not require the extra level shifting circuitry of the prior art.

In the compensation loop of the present invention, VCO core 208 and capacitors 227 and 228 function identically to the VCO core 202 and capacitors 203 and 204 in the VCO block. Thus, voltages at nodes 229 and 230 (labeled MIRA and MIRB) track the voltages at nodes 217 and 218 (labeled VCOA and VCOB). The track-and-hold blocks 219 and 220 are clocked such that they hold the peak values of the ramping voltages on nodes 229 and 230, respectively. The peak voltages for this embodiment are actually minimums, as the voltages are falling from a high value to a lower trigger point. (The circuit may be designed with the ramping voltages progressing from a low point to a higher trigger point). The voltage obtained by the track-and-hold circuit is not the voltage value of nodes 217 and 218 when they cross the threshold voltage value on line 225, but the voltage value of these nodes after the comparator and latch delay. Thus, these voltage values provide an indication of the delay error of the circuit. Before being supplied to the difference amplifier, the values held within the track-and-hold circuits are passed through a low pass filter to moderate the feedback and prevent instability.

Difference amplifier 211 receives a constant reference voltage from a source external to the circuit, and compares this reference voltage with the filtered peak voltage supplied by track-and-hold circuits 219 and 220. The output of the difference amplifier represents the threshold voltage signal 225 and is the sum of the reference voltage signal and an amplified error (difference) term. The gain of the difference amplifier in the present invention is greater than one to achieve better cancellation of the delay. The compensation loop operates such that the threshold voltage is increased until the voltage achieved by the VCO core outputs, taken after the comparator and latch delays, is equal to the reference voltage.

The transfer function for the present invention is:

$$F_{OUT}=I/\{2[CRef+Idelv/(N+1)]\} \qquad \text{(equation 11)}$$

where C is the capacitance of capacitors 203, 204, 227 and 229, Ref is the ideal voltage excursion (equivalent to VPOS-"external reference") and N is the gain of the difference amplifier. It is clear that the use of the new compensation loop results in smaller effective delay. The effective delay with the compensation loop is reduced by a factor of (N+1) over the uncompensated circuit. Even for a small value of N, such as N equals ten, the effects of the delay can be reduced significantly. As an example, an eleven nanosecond delay is reduced to an effective delay of one nanosecond. This translates to an increase in the maximum linear frequency operation of the VCO from 5 MHz to 50 MHz (delay should be less than five percent of the period of oscillation). From equation 10 of the prior art method, the delay of the VCO (delv) is reduced by the factor $C_H/C_V$, but at the cost of introducing the delay term of the frequency-to-voltage converter (delf) and the supply dependent parasitic delay term (CpVPOS/I).

Whereas the prior art method of compensation is subject to process-dependent VCO parameters, parasitics, and supply dependent delays, in the present invention, the effects of temperature and process are minimized. The present invention provides a method for extending the upper frequency range of the all-CMOS VCO, of cancelling the effects of process-dependent VCO parameters (center frequency), of maintaining a constant VCO gain (linearity) and of cancelling the effects of supply and temperature.

Figure 5A:
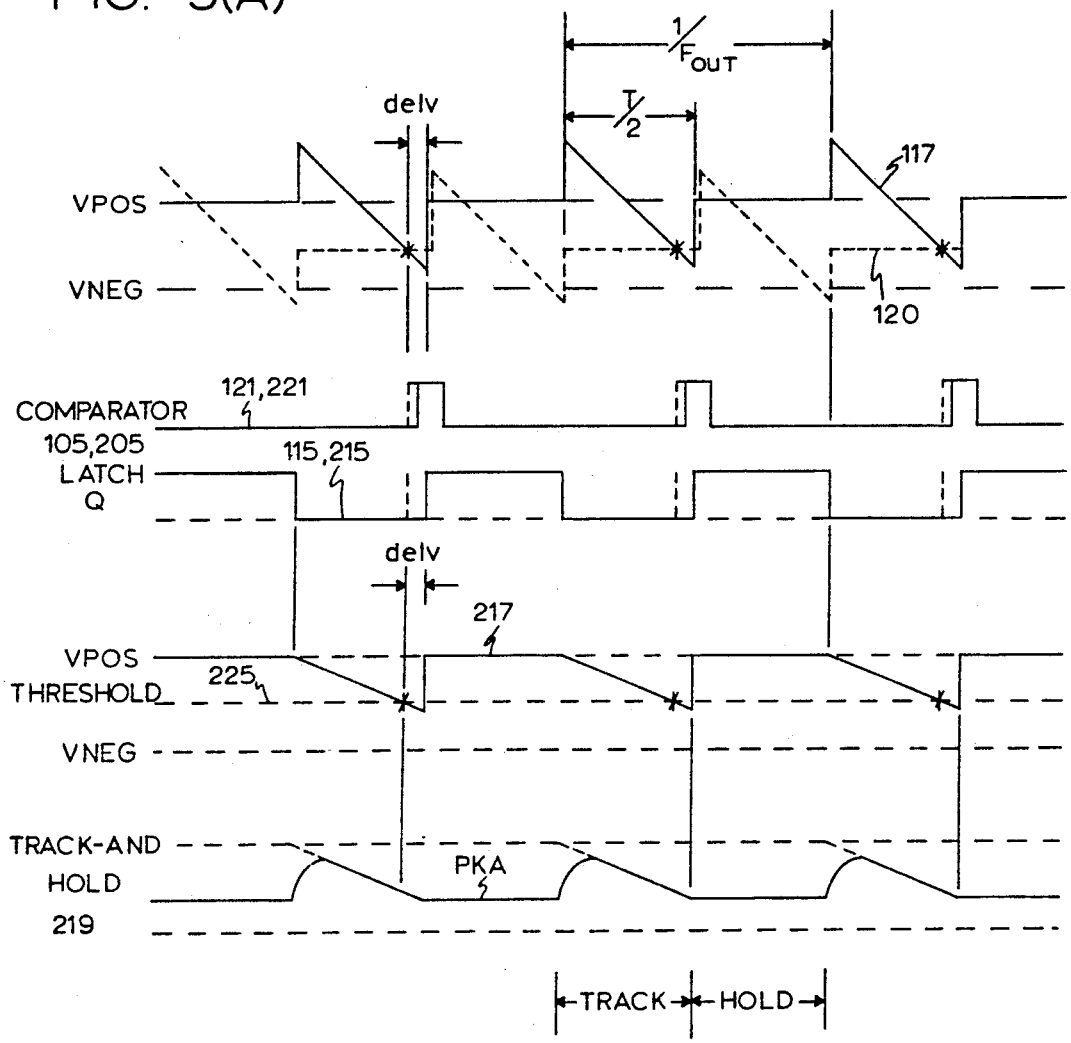
FIGS. 5A-B are timing diagrams of signals from the prior art compensated VCO and the compensated VCO of the present invention.

FIG. 5A illustrates a timing diagram of voltage signals in both the prior art scheme and the method of the present invention. At the top of FIG. 5A, voltage signal 117 is represented by the solid line and the level shifted voltage signal 120 is represented by the dashed line. Voltage signal 117 begins in the "charge" state approximately one diode voltage drop below the positive voltage supply value then experiences a voltage spike of roughly the amount of the level shift due to a jump in voltage level of voltage signal 118 (not shown) on the other node of capacitor 114. Voltage signal 117 then ramps downwards, crossing level shifted signal 120 and continuing down for a time period equal to the comparator/latch delay delv. Voltage signal 117 then jumps up to roughly one diode drop below the positive voltage supply value again to continue the cycle. The half cycle of this oscillator is equivalent to the time interval wherein voltage signal 117 is ramping downwards. Voltage signals 118 and 119 exhibit the same waveforms as signals 117 and 120, respectively, offset by one half-cycle.

Voltage signal 217 begins at the positive voltage supply value and begins ramping down at the same moment that voltage signal 218 (not shown) is charged to the positive voltage supply level. Voltage signal 217 ramps downward passing threshold voltage signal 225 and continues ramping downwards for a time period equivalent to the comparator/latch delay and then charges back to the voltage supply level to begin another cycle. Voltage signal 218 is identical to voltage signal 217 except for an offset of one half-cycle. Comparators 105 and 205 pulse high some time delay after the crossing of the trip voltage. This delay is equivalent to the comparator delay. Signals 115 and 215 generate a rising edge one comparator/latch delay, delv, after the threshold crossing. Track-and-hold circuit 219 tracks voltage signal 217 while signal 217 is ramping downwards. At the rising edge of signal 215, track and hold 219 goes into a hold mode until the falling edge of signal 215. Track-and-hold 220 operates similarly, offset by one half-cycle.

Figure 5B:
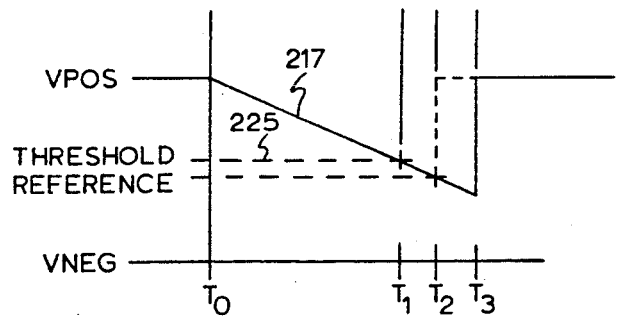

FIG. 5B is an expanded view of voltage signal 217 showing compensation of the signal. The solid line shows an uncompensated system. Ramping voltage 217 begins ramping downwards at time $T_0$, crosses the reference voltage at time $T_2$ and rises back to the positive voltage supply value after a comparator/latch delay at time $T_3$. The dashed line represents signal 217 in a compensated system. The threshold signal 225 has been adjusted to be slightly above the reference voltage. This causes ramping signal 217 to cross the threshold voltage at a time $T_1$ such that after the comparator/latch delay, voltage signal 217 rises to the positive voltage supply value at time $T_2$. Thus the ideal half-cycle has been achieved. In the compensated scheme $T_2-T_1=T_3-T_2=$delv.

Figure 6A:
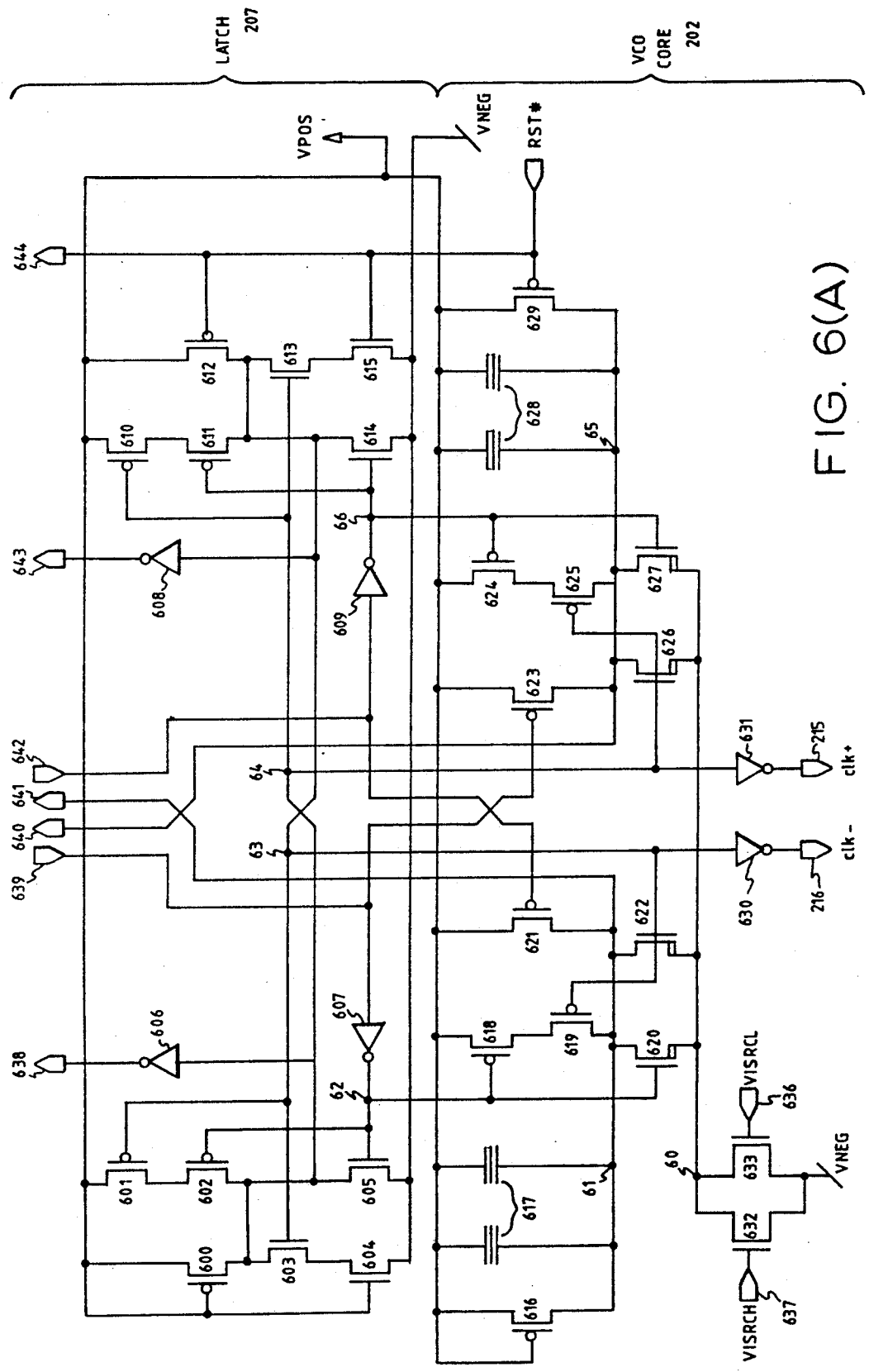
FIGS. 6A-B show a detailed circuit diagram of the VCO block of the preferred embodiment of the present invention.
Figure 6B:
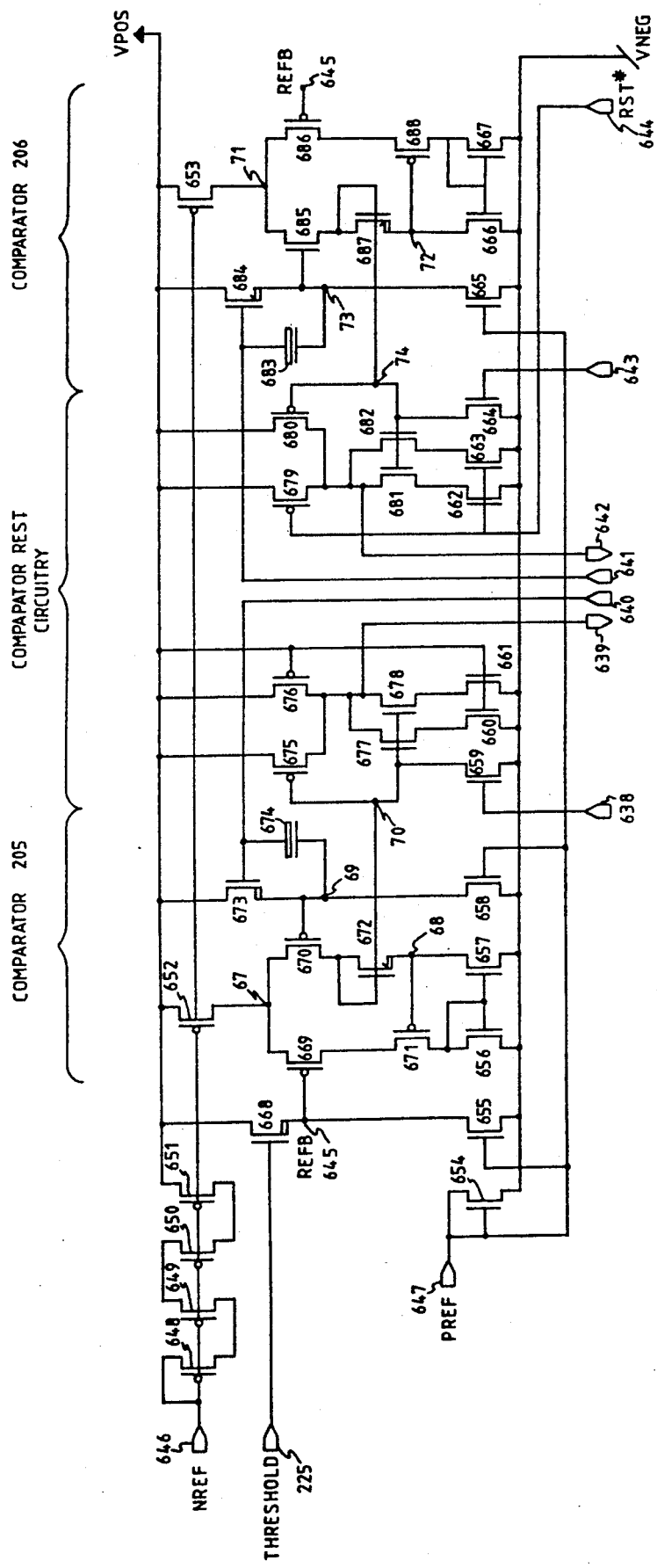

FIGS. 6A and 6B illustrate a detailed circuit diagram of the VCO block of the preferred embodiment of the present invention. In FIG. 6A, NMOS transistors 632 and 633 are coupled in parallel between node 60 and the negative voltage supply. Transistors 632 and 633 receive as inputs VISRCH 637 and VISRCL 636. The current flowing through transistor 632 and 633 is the control current I 130. NMOS transistors 620 and 622 are coupled in parallel between node 61 and node 60. PMOS transistors 618 and 619 are coupled in series between the positive voltage supply and node 61. The gates of transistors 618 and 620 are coupled to node 62. The gates of transistors 619 and 622 are coupled to node 63. PMOS transistor 621 is coupled between the positive voltage supply and node 61 with its gates coupled to node 642. PMOS transistor 616 and capacitors 617 are coupled in parallel between the positive voltage supply and node 61 (also labelled 641). The gate of transistor 616 is coupled to the positive voltage supply. NMOS transistors 626 and 627 are coupled in parallel between node 60 and node 65.

PMOS transistors 624 and 625 are coupled in series between the positive voltage supply and node 65 (also labelled 640). The gates of transistors 625 and 626 are coupled to node 64 whereas the gates of transistors 624 and 627 are coupled to node 66. PMOS transistors 629 and 623 and capacitors 628 are coupled in parallel between the positive voltage supply and node 65. The gate of transistor 623 is coupled to node 639 and the gate of transistor 629 is coupled to node 644. Coupled to node 644 is a RST* input which allows for the circuit to be reset externally. The VCO core block 202 of FIG. 4 comprises of elements 616–629.

PMOS transistor 600 is coupled between the positive voltage supply and node 64. PMOS transistors 601 and 602 are coupled in series between the positive voltage supply and node 64. NMOS transistors 603 and 604 are coupled in series between node 64 and the negative voltage supply. NMOS transistor 605 is also coupled between node 64 and the negative voltage supply. The gates of transistors 600 and 604 are coupled to the positive voltage supply, the gates of transistors 601 and 603 are coupled to node 63, and the gates of transistors 602 and 605 are coupled to node 62. The input of inverter 606 is coupled to node 64 and the output is coupled to node 638. The input of inverter 607 is coupled to node 639 and the output is coupled to node 62.

The input of inverter 608 is coupled to node 63 and the output is coupled to node 643. The input of inverter 609 is coupled to node 642 and the output is coupled to node 66. PMOS transistors 610 and 611 are coupled in series between the positive voltage supply and node 63. PMOS transistor 612 is also coupled between the positive voltage supply and node 63. NMOS transistors 613 and 615 are coupled in series between node 63 and the negative voltage supply. NMOS transistor 614 is also coupled between node 63 and the negative voltage supply. The gates of transistors 610 and 613 are coupled to node 64, the gates of transistors 611 and 614 are coupled to node 66, and the gates of transistors 612 and 615 are coupled to node 644. The input of inverter 630 is coupled to node 63 and the output provides signal 216 (clk−). The input of inverter 631 is coupled to node 64 and the output provides signal 215 (clk +). The latch 207 of FIG. 4 comprises of elements 600–615.

In FIG. 6B, PMOS transistors 648–651 are coupled in series between the positive voltage supply and input node 646 (NREF). NMOS transistor 654 is coupled between input nodes 647 (PREF) and the negative voltage supply. NMOS transistor 668 is coupled between the positive voltage supply and reference node 645 (REFB). The gate of transistor 668 is coupled to threshold signal 225 from the compensation circuit. NMOS transistor 655 is coupled between reference node 645 and the negative voltage supply. PMOS transistor 652 is coupled between the positive voltage supply and node 67. PMOS transistor 669, 671 and NMOS transistor 656 are coupled in series between node 67 and the negative voltage supply. The gate of transistor 669 is coupled to reference node 645, the gate of transistor 671 is coupled to node 68, and the gate of transistor 656 is coupled to the drain of transistor 656. PMOS transistor 670 is coupled between node 67 and node 70, with its gate coupled to node 69.

NMOS transistor 672 is coupled between node 70 and node 68, with its gate coupled to node 70. NMOS transistor 657 is coupled between node 68 and the negative supply voltage, with its gate coupled to the gate of transistor 656. NMOS transistor 673 is coupled between the positive supply voltage and node 69, with its gate coupled to node 640. Capacitor 674 is coupled between node 640 and node 69. NMOS transistor 658 is coupled between node 69 and the negative voltage supply. PMOS transistor 675 and 676 are coupled in parallel between node 639 and the positive voltage supply. NMOS transistors 660 and 677 are coupled in series between node 639 and the negative voltage supply.

NMOS transistors 661 and 678 are also coupled in series between node 639 and the negative voltage supply. NMOS transistor 659 is coupled between node 70 and the negative voltage supply. Transistors 675, 677 and 678 are gate coupled to node 70. Transistors 660, 661 and 676 are gate coupled to the positive voltage supply. Transistor 659 is gate coupled to node 638. PMOS transistor 679 and 680 are coupled in parallel between the positive voltage supply and node 642. NMOS transistors 662 and 681 are coupled in series between node 642 and the negative voltage supply. NMOS transistors 663 and 682 are also coupled in series between node 642 and the negative voltage supply. Transistor 664 is coupled between node 74 and the negative voltage supply. The gates of transistors 662, 663 and 679 are gate coupled to node 644.

Transistors 680, 681 and 682 are gate coupled to node 74. Transistor 664 is gate coupled to node 643. Capacitor 683 is coupled between node 641 and node 73. NMOS transistor 684 is coupled between the positive voltage supply and node 73. NMOS transistor 665 is coupled between node 73 and the negative voltage supply. The gate of transistor 684 is coupled to node 641. PMOS transistor 653 is coupled between the positive voltage supply and node 71. PMOS transistor 685 is coupled between node 71 and node 74. NMOS transistor 687 is coupled between node 74 and node 72. NMOS transistor 666 is coupled between node 72 and the negative voltage supply. PMOS transistors 686, 688 and NMOS transistor 667 are coupled in series between node 71 and the negative voltage supply.

The gate of transistor 685 is coupled to node 73, the gate of transistor 687 is coupled to node 74, and the gate of transistor 688 is coupled to node 72. The gate of transistor 686 is coupled to reference node 645 to receive reference voltage REFB. The gates of transistors 666 and 667 are coupled to the drain of transistor 667. The gates of transistors 648-653 are coupled to node 646. The gates of transistors 654, 655, 658, and 665 are coupled to node 647.

Transistors 652, 656, 657, 669-672 form comparator 205 of FIG. 4. Transistors 653, 666, 667, 685-688 form comparator 206. Transistors 655, 658, 665, 668, 673 and 684 form level shifting circuitry to enhance the performance of the comparators. The value of the level shifting is determined by the value PREF at node 647. Transistors 648-653 determine the operating currents for comparators 205 and 206 which are dependent on the value NREF at node 646. Transistors 659-661 and 675-678 form output and reset circuitry for comparator 205. Transistors 662-664 and 679-682 form output and reset circuitry for comparator 206. The comparators shown in this schematic are high speed threshold crossing detectors as disclosed in co-pending U.S. patent application Ser. No. 779,963 entitled "High Speed Threshold Crossing Detector with Reset" filed Oct. 21, 1991, and assigned to the present assignee.

Figure 7A:
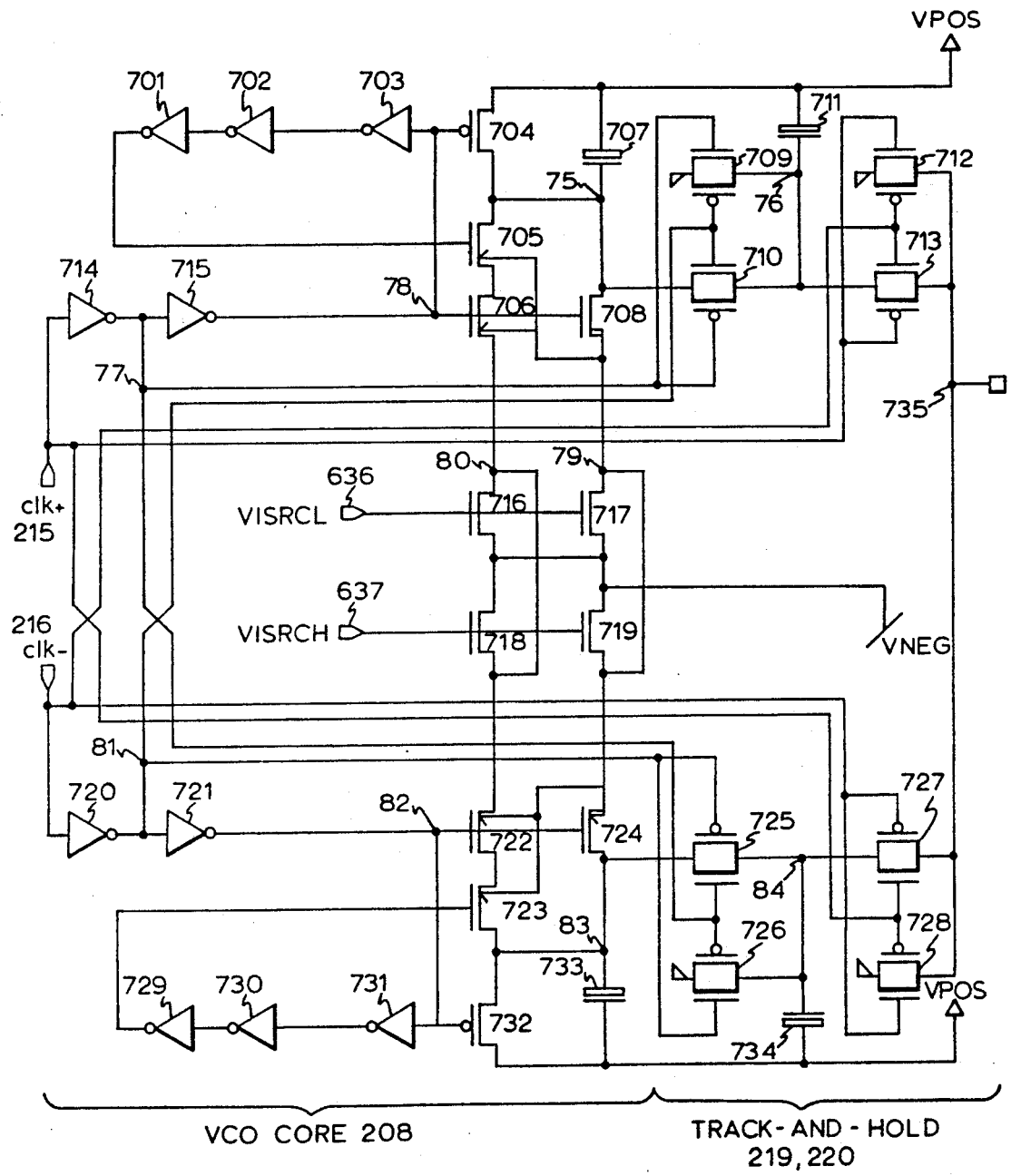
FIGS. 7A-B show a detailed circuit diagram of the compensation loop of the preferred embodiment of the present invention.
Figure 7B:
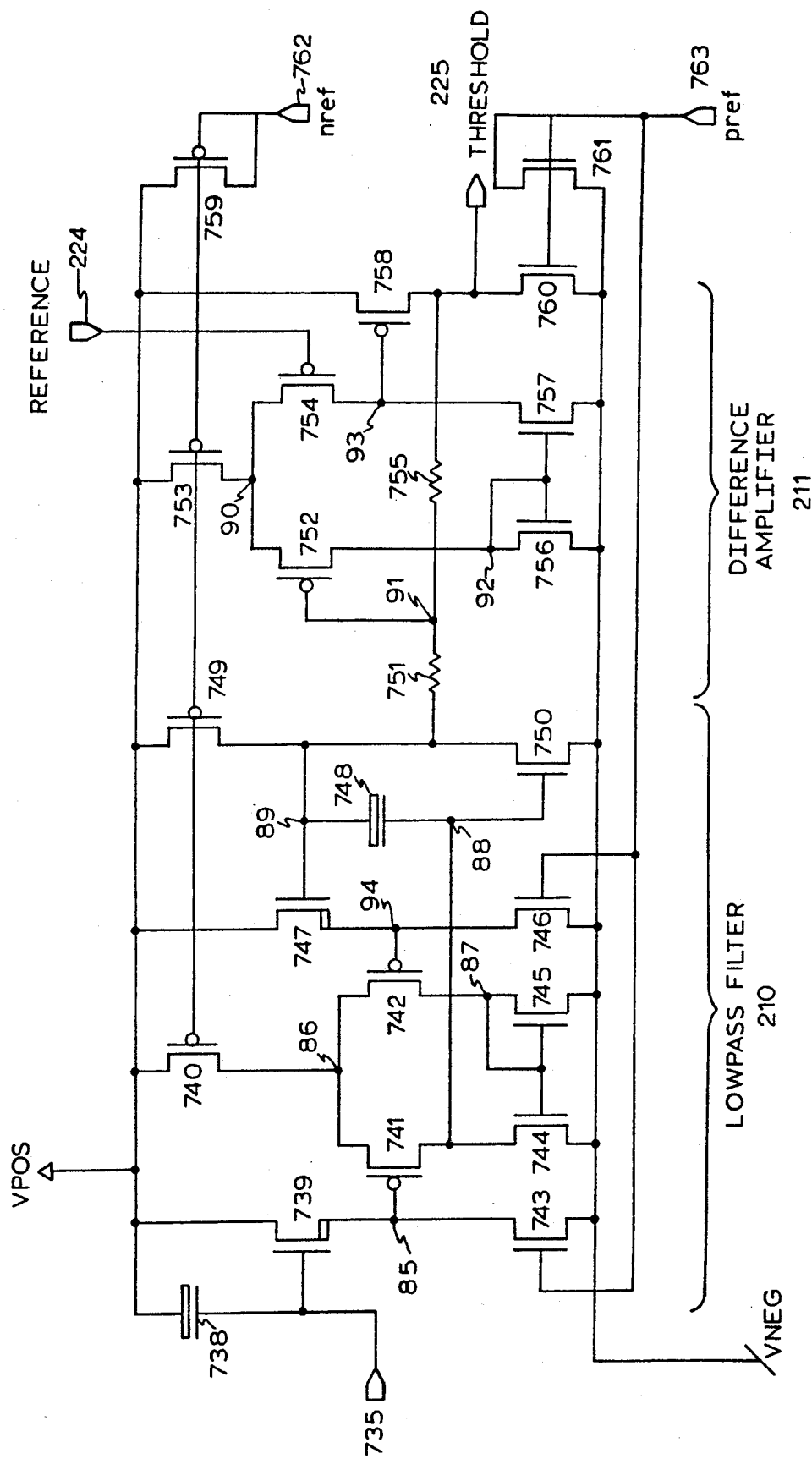

FIGS. 7A-7B form a detailed circuit diagram of the compensation circuit of the preferred embodiment of the present invention. In FIG. 7A, NMOS transistors 716 and 718 are coupled in parallel between node 80 and the negative voltage supply. NMOS transistors 717 and 719 are coupled in parallel between node 79 and the negative voltage supply. The gates of transistors 716 and 717 are coupled to input nodes 636 to receive voltage signal VISRCL. The gates of transistors 718 and 719 are coupled to input nodes 637 to receive input signal VISRCH. VISRCL and VISRCH make up the voltage input $V_{IN}$. The current flowing from node 80 to the negative voltage supply and node 79 to the negative voltage supply is equivalent to current signal 113 of FIG. 4. NMOS transistors 705 and 706 are coupled in series between node 75 and node 80. The bulk of transistors 705 and 706 is coupled to node 79. NMOS transistor 708 is coupled between node 75 and node 79. PMOS transistor 704 is coupled between the positive voltage supply and node 75.

The gates of transistor 704, 706 and 708 are coupled to node 78. Inverters 701, 702 and 703 are coupled in series with the initial input coupled to node 78 and the final output coupled to the gate of transistor 705. Inverter 714 has input coupled to clk+ terminal 215 and output coupled to node 77. Inverter 715 has input coupled to node 77 and output coupled to node 78. Capacitor 707 is coupled between the positive voltage supply and node 75. Inverter 720 has input coupled to clk− terminal 216 and output coupled to node 81. Inverter 721 has input coupled to node 81 and output coupled to node 82. NMOS transistors 722 and 723 are coupled in series between nodes 80 and 83. NMOS transistor 724 is coupled between nodes 79 and 83. PMOS transistor 732 is coupled in parallel with capacitor 733 between node 83 and the positive voltage supply. The gates of transistors 722, 724 and 732 are coupled to node 82. The bulks of transistors 722 and 723 are coupled to node 79. Inverters 729-731 are coupled in series with the initial input coupled to node 82 and the final output coupled to the gate of transistor 723. Elements 701-708, 714-724 and 729-733 form the VCO core 208 of FIG. 4.

The N channel control of switch 709 and the P channel control of switch 710 are coupled to node 77. The P channel control of switch 709 and the N channel control of switch 710 are coupled to node 81. Switch 709 is coupled between node 76 and an open circuit. Switch 710 is coupled between node 76 and node 75. Capacitor 711 is coupled between the positive voltage and node 76. The N channel control of switch 712 and the P channel control of switch 713 are coupled to node 215. The P channel control of switch 712 and the N channel control of switch 713 are coupled to node 216. Switch 712 is coupled between node 735 and an open circuit. Switch 713 is coupled between node 735 and node 76. The P channel control of switch 725 and the N channel control of switch 726 are coupled to node 81. The N channel control of switch 725 and the P channel control of switch 726 are coupled to node 77. Switch 725 is coupled between node 83 and node 84. Switch 726 is coupled between node 84 and an open circuit. Capacitor 734 is coupled between the positive voltage supply and node 84. The P channel control of switch 727 and the N channel control of switch 728 are coupled to node 216. The N channel of switch 727 and the P channel control of switch 728 are coupled to node 215. Switch 727 is coupled between node 84 and node 735 switch 728 is coupled between node 735 and an open circuit. The circuit elements 709–713, 725–528, 734 and 738 (see capacitor in FIG. 7B) form the track and hold circuits 219 and 220 of FIG. 4.

In FIG. 7B, capacitor 738 is coupled between the positive voltage supply and node 735. NMOS transistor 739 is coupled between the positive voltage supply and node 85 with its gates coupled to node 735. NMOS transistor 743 is coupled between node 85 and the negative voltage supply. NMOS transistor 740 is coupled between the positive voltage supply and node 86. PMOS transistor 741 is coupled between node 86 and node 88, with its gate coupled to node 85. PMOS transistor 742 is coupled between node 86 and node 87, with its gate coupled to node 94. NMOS transistor 744 is coupled between node 88 and the negative voltage supply. NMOS transistor 745 is coupled between node 87 and the negative voltage supply. The gates of transistors 744 and 745 are coupled to node 87. NMOS transistor 747 is coupled between the positive voltage supply and node 94, with its gate coupled to node 89. NMOS transistor 746 is coupled between node 94 and the negative voltage supply. Capacitor 748 is coupled between node 89 and node 88. PMOS transistor 749 is coupled between the positive supply voltage and node 89. Transistor 750 is coupled between node 89 and the negative voltage supply, with its gate coupled to node 88. Resistor 751 is coupled between node 89 and 91. Node 91 is coupled to the gate of transistor 752 and resistor 752. PMOS 753 is coupled between the positive voltage supply and node 90. PMOS transistor 752 is coupled between node 90 and node 92. PMOS transistor 754 is coupled between node 90 and node 93, with its gate coupled to reference input terminal 224. NMOS transistor 756 is coupled between node 92 and the negative voltage supply.

NMOS transistor 757 is coupled between node 93 and the negative voltage supply. The gates of transistors 756 and 757 are coupled to node 92. Resistor 755 is coupled between threshold node 225 and node 91. PMOS transistor 758 is coupled between the positive voltage supply and node 225, with its gate coupled to node 93. NMOS transistor 760 is coupled between node 225 and the negative voltage supply. Transistor 761 is coupled between input terminal 763 (PREF) and the negative voltage supply. Transistor 759 is coupled between input terminal 762 (NREF) and the positive voltage supply. The gates of transistor 740, 749, 753 and 759 are also coupled to terminal 762. The gates of transistors 743, 746, 760 and 761 are coupled to terminal 763. Transistors 740, 749, 753, 759, 743, 746, 760 and 761 are responsible for setting operating currents in the circuitry. The other circuit elements of FIG. 7B constitute low pass filter 210 and difference amplifier 211.

Thus, a linearized and delay-compensated VCO has been described.

We claim:

1. A method of delay compensating the generation of a signal having two states, said method comprising the steps of:
    generating a first ramping signal responsive to an input signal, said ramping signal having an actual amplitude range and an ideal amplitude range;
    comparing said first ramping signal to a threshold signal for determining a threshold crossing of said ramping signal with said threshold signal;
    producing an output signal having at least two states, said output signal changing states dependent on said threshold crossing;
    generating a second ramping signal responsive to said output signal, said second ramping signal mirroring said first ramping signal;
    determining an amplitude level of said second ramping signal when said output signal changes state, said amplitude level of said second ramping signal corresponding to a delay between said first ramping signal crossing said threshold signal and a change in said states of said output signal; and
    adding said amplitude level of said second ramping signal to a reference signal for modifying said threshold signal, said threshold signal minimizing a difference between said actual amplitude range and said ideal amplitude range of said first ramping signal.

* * * * *